US005344786A

United States Patent [19]

Bayraktaroglu

[11] Patent Number: 5,344,786

[45] Date of Patent: Sep. 6, 1994

[54] METHOD OF FABRICATING SELF-ALIGNED HETEROJUNCTION BIPOLAR TRANSISTORS

[75] Inventor: Burhan Bayraktaroglu, Plano, Tex.

[73] Assignee: Texas Instruments Incorporated, Dallas, Tex.

[21] Appl. No.: 942,474

[22] Filed: Sep. 9, 1992

Related U.S. Application Data

[63] Continuation of Ser. No. 576,540, Aug. 31, 1990, abandoned.

[51] Int. Cl.5 .......... H01L 21/265

[52] U.S. Cl. .......... 437/31; 437/133; 437/984; 257/200; 148/DIG. 72

[58] Field of Search .......... 437/31, 32, 133; 148/DIG. 72; 257/200

[56] References Cited

U.S. PATENT DOCUMENTS

| | | | |
|---|---|---|---|
| 4,272,348 | 6/1981 | Cox et al. | 156/643 |
| 4,380,774 | 4/1983 | Yoder | 357/34 |
| 4,593,305 | 6/1986 | Kurata et al. | 357/34 |
| 4,617,724 | 10/1986 | Yokayama et al. | 29/576 B |
| 4,672,419 | 6/1987 | McDavid | 357/71 |
| 4,674,174 | 6/1987 | Kishita et al. | 437/192 |
| 4,679,305 | 7/1987 | Morizuka | 29/576.3 |
| 4,746,626 | 5/1988 | Eda et al. | 357/34 |
| 4,872,040 | 10/1989 | Jackson | 557/16 |
| 4,889,821 | 12/1989 | Selle et al. | 437/31 |
| 4,965,650 | 11/1990 | Inada et al. | 357/34 |
| 4,967,252 | 11/1990 | Awano | 357/34 |
| 4,989,831 | 12/1991 | Ishii et al. | 357/16 |
| 5,124,270 | 6/1992 | Morizuka | 148/DIG. 72 |
| 5,166,081 | 11/1992 | Inada et al. | 437/31 |
| 5,168,071 | 12/1992 | Fullowan et al. | 437/31 |
| 5,171,697 | 12/1992 | Liu et al. | 437/133 |

FOREIGN PATENT DOCUMENTS

| | | | |
|---|---|---|---|
| 0281235 | 1/1988 | European Pat. Off. . | |
| 0367698 | 9/1989 | European Pat. Off. . | |
| 0419062 | 8/1990 | European Pat. Off. . | |
| 63-16663 | 1/1982 | Japan | 437/31 |
| 63-40323 | 2/1988 | Japan . | |
| 0114258 | 5/1988 | Japan | 357/16 |
| 63-124465 | 5/1988 | Japan | 437/31 |
| 63-200567 | 8/1988 | Japan . | |
| 1-189167 | 7/1989 | Japan | 437/31 |
| 0273353 | 11/1989 | Japan | 437/31 |
| 0188964 | 7/1992 | Japan | 357/34 |

OTHER PUBLICATIONS

AlGaAs/GaAs Heterojunction bipolar transistors, Tatsuo Izawa, Tadao Ishibashi and Takayuki Sugeta, IEDM Technical Digest, Dec. 1985 (12.5).

Salicide with Buried Siclcide Layer, N. J. Jones & S. S. Roth, IBM Technical Disclosure Bulletin vol. 27 No. 2 Jul. 1984.

Howes et al. "Gallium Arsenide Materials, Devices, and Circuits" 1985, pp. 171–173 edited by M. J. Howes and D. V. Morgan, John Wiley and Sons Publication, New York.

*Primary Examiner*—Olik Chaudhuri
*Assistant Examiner*—Long Pham
*Attorney, Agent, or Firm*—Michael K. Skrehot; James C. Kesterson; Richard L. Donaldson

[57] ABSTRACT

A method of fabricating heterojunction bipolar transistors (HBTs) including epitaxial growth of collector, base and emitter layers, allowing for self-aligned emitter-base contacts to minimize series base resistance and to reduce total base-collector capacitance.

12 Claims, 3 Drawing Sheets

120
110
116
118
116
108
114
118
BASE
104
COLLECTOR
102
SUBSTRATE
101

METHOD OF FABRICATING SELF-ALIGNED HETEROJUNCTION BIPOLAR TRANSISTORS

This application is a continuation of application Ser. No. 07/576,540, filed Aug. 31, 1990, now abandoned.

BACKGROUND OF THE INVENTION

1. Field of the Invention

The present invention relates to the fabrication of semiconductor electronic integrated circuits, and, more particularly, to the fabrication of III-IV compound semiconductors containing heterojunction bipolar transistors.

2. Description of the Related Art

Most high speed microwave heterojunction bipolar transistors (HBTs) require self-aligned emitter-base contacts to minimize series base resistance and to reduce total base-collector capacitance. The present methods can be broadly divided into two groups. In the first group are those methods employing chemical etching and in the second group are those employing dry etching techniques.

When using chemical etching processes, the emitter contact cannot be used as a mask for etching through the emitter layer to the base layer due to galvanic effects. Therefore, the methods of the first group always use re-aligned emitter contacts, which places a limit on the minimum emitter size that can be used, typically 2 microns.

The dry etching techniques of the second group use reactive ion etching (RIE) or ion milling to remove the unwanted portions of the emitter layer. Either angle evaporation or sidewall insulators are then used to ensure controlled emitter-base separation. The angle evaporation method is limited to approximately 1.5 micron emitter geometries whereas the ion mill/sidewall method introduces too much damage to the emitter-base interface due to high energy bombardment of the surface.

Thus there is a need for a method of fabricating emitter-base contacts of a HBT in a self-aligned process that does not limit emitter size and can accommodate different thicknesses of emitters.

SUMMARY OF THE INVENTION

The present invention provides a method of fabrication of heterojunction bipolar transistors (HBTs) including epitaxial growth of base and emitter layers for the HBT. This process allows for self-aligned emitter-base contacts to minimize series base resistance and to reduce total base-collector capacitance.

In preferred embodiments, the epitaxial in situ doped collector, base and emitter layers are grown over an entire semi-insulating GaAs substrate. The wafer is then covered with a metal emitter contact layer followed by an insulator layer. Next, the emitter areas are patterned and etched down to the emitter epilayer, sidewalls are formed on the resulting islands and the exposed portions of the emitter epilayer are chemically etched down to the base epilayer. Finally, base contacts are deposited and the emitter contact is covered with deposited metal.

This process solves the problems of the known methods of fabricating emitter-base contacts of a HBT in a self-aligned process by not limiting emitter size while accommodating different thicknesses of emitters.

BRIEF DESCRIPTION OF THE DRAWINGS

The drawings are schematic and the vertical has been exaggerated for clarity.

DESCRIPTION OF THE PREFERRED EMBODIMENTS

A first preferred embodiment method for fabricating high power heterojunction bipolar transistors (HBTs) includes the following steps as illustrated in cross sectional elevation views in FIGS. 1 through 4.

Figure 1:
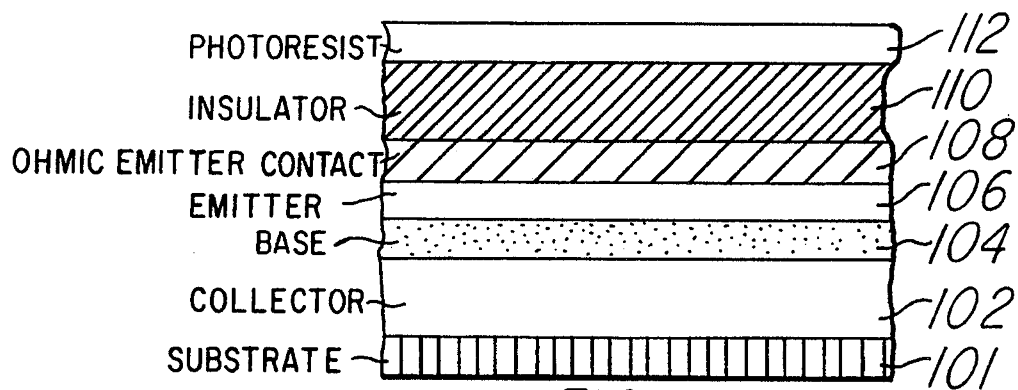
FIGS. 1–4 are cross sectional elevation views of a first preferred embodiment and the steps of a first preferred embodiment fabrication method.
Figure 2:
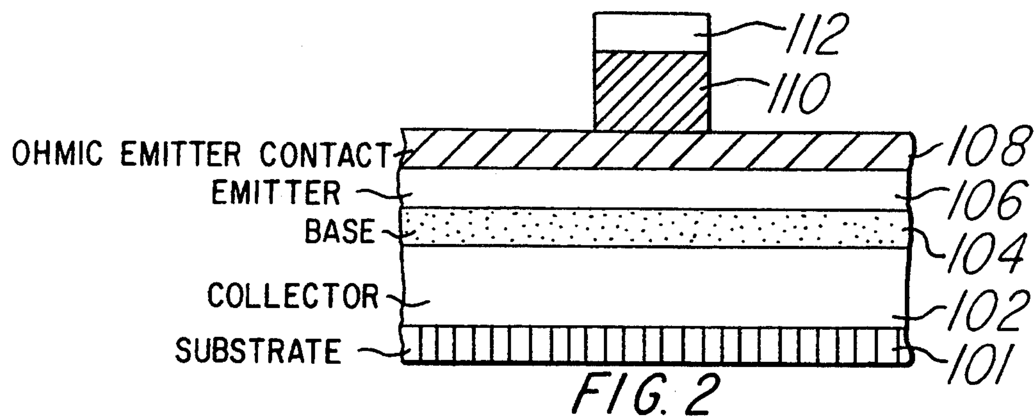

(a) A substrate material for this process is shown in FIG. 1; note that the vertical is exaggerated in the drawings for clarity. It is composed of a semi-insulating semiconductor material 101 (such as GaAs) of (100) orientation.

(b) A GaAs collector layer 102 is epitaxially grown by a suitable process (such as Metal Organic Chemical Vapor Deposition, or MOCVD) to a thickness of one micron and doped with Si to a concentration of $2\times10^{16}$ cm$^{-3}$.

(c) A base epilayer 104 of GaAs is deposited onto the collector 102 at a thickness of 0.1 micron and doped with Zn or Be to a concentration of $>1\times10^{19}$ cm$^{-3}$. Emitter epilayer 106 of n-type $Al_xGa_{1-x}As$ is then deposited onto base layer 104 at a thickness of 0.05 micron by epitaxy. Next, 500 Angstrom thick AuGe emitter ohmic contact metal, followed by 140 Angstrom Ni and 2000 Angstrom Au layers are evaporated onto the surface. Insulator layer 110 is then formed of a suitable material (such as $SiO_2$ or $Si_3N_4$) at a thickness of 4000 Angstroms by chemical vapor deposition (CVD). A photoresist 112 is then spun on the previous layers and patterned to define the location of the HBT emitters. The emitter locating insulator islands 110 are then created by a reactive ion etch (RIE) of the insulator material not protected by the photoresist using $CF_4$ and $O_2$. Photoresist 112 may optionally be removed after RIE. This yields the structure of FIG. 2.

Figure 3:
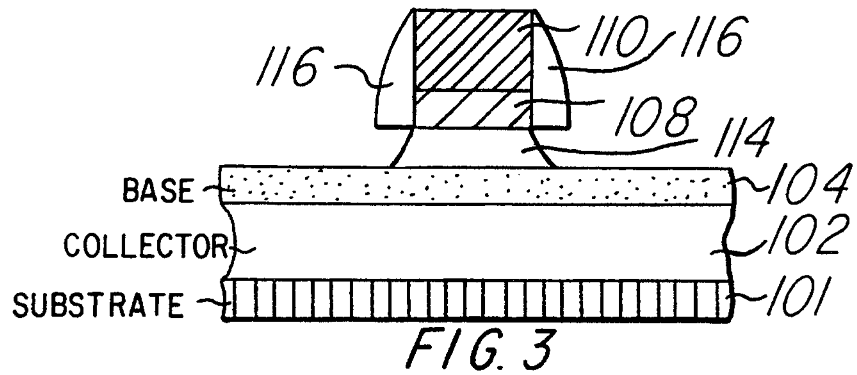
Figure 4:
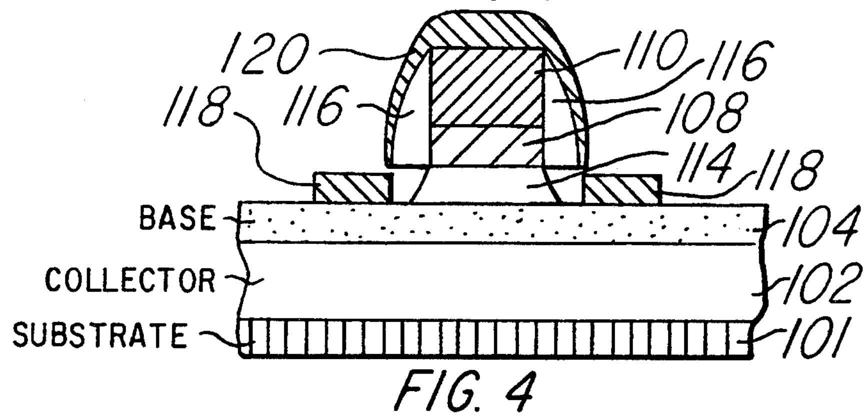

(c) Ohmic contact layer 108 is then removed from areas not protected by the insulator islands 110 by ion milling using Ar, preferably at a 30° angle to minimize backsputtering, creating emitter contact 108. Photoresist 112 is then stripped if not done so previously. Sidewalls 116 are formed by depositing a 4000 Angstrom $Si_3N_4$ (or $SiO_2$) layer over the entire surface using CVD techniques. This assures an isotropic coverage. The insulator is then etched in low pressure (about 10–20 mTorr) $CF_4/O_2$ RIE, making sure that the etch is anisotropic. The etch is continued until all of the insulator material on the flat wafer surface is removed. Due to the anisotropic nature of the etch, a portion of the insulator material remains along the edges of insulator islands 110 and emitter contacts 108 as shown in FIG. 3. Next, the areas of emitter epilayer 106 that are not protected by insulator islands 110 and sidewalls 116 are chemically etched down to base epilayer 104 in, for example, a solution of $H_2SO_4$:$H_2O_2$:$H_2O$ in the ratio of 1:8:160 (by volume) as shown in FIG. 3.

(d) Photoresist is again spun on and patterned to define the location of the base contacts 118; this exposes insulator islands 110 and sidewalls 116 in addition to a portion of the base epilayer 104. Ti/Pt/Au metals are evaporated in sequence at thicknesses of 500, 250 and 1500 Angstroms, respectively, onto the photoresist and exposed areas. The overhanging sidewalls 116 shadow the part of the base epilayer 104 adjacent to emitter 114, so the evaporated metal does not contact emitter 114. The photoresist is then removed which lifts off the metal except the portion 118 which is on the base epilayer 104 and the portion 120 which is on insulator island 110 and sidewalls 116. See FIG. 4. It should be noted that if base contacts 118 are not thicker than the emitter 114 (0.2 micron) the metal 120 over the emitter contact will not touch base contacts 118. If base contacts 118 are made thicker than emitter 114, the base contact 118 may be made to be continuous over the emitter 114. This will increase the emitter-base capacitance but reduce the base series resistance.

The sidewall 116 covers the edges of the emitter contact layer 108, thus preventing electrical shorts between the emitter layer 106 and the base layer 104. It also isolates emitter contact metal 108 from the chemical etchants so that galvanic effects do not modify the etch profile.

The sidewall thickness (in the direction parallel to the substrate surface) determines the emitter-base separation. It is chosen to be roughly equal to the emitter layer 106 thickness. In this way, the emitter 106 size is roughly the same as the emitter contact 108 size, due to the fact that the chemical etch will remove material at the same rate perpendicular to the emitter layer 106 surface as well as parallel to the surface (under the sidewall 116 overhang). because the undercut resulting from the chemical etch is the same as the sidewall 116 thickness (if the sidewall 116 thickness is made equal to emitter layer 106 thickness), no limitation on the emitter contact 108 size exists. It can be made very narrow with this method, i.e. $<1$ micron. Experiments have been carried out to show the feasibility of at least 0.7 micron dimensions with all optical lithography.

MODIFICATIONS AND ADVANTAGES

Various modifications of the preferred embodiment fabrication method may be made while retaining the basic features of the self-aligned emitter-base contacts.

Figure 5:
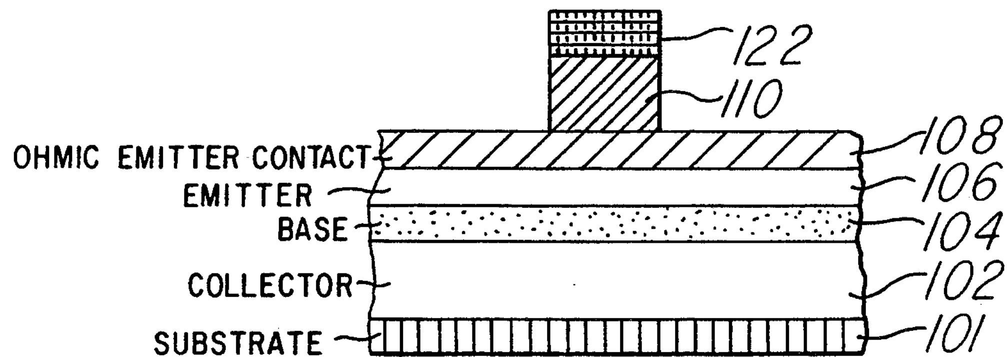
FIG. 5 is a cross sectional elevation view of a first modification to the first preferred embodiment and the steps of the first preferred embodiment fabrication method.

For example, a first modification may be made to the method of defining the emitter area with patterned photoresist layer 112 (the last portion of step (b) of the first preferred embodiment) by substituting the following steps:

(1) Photoresist is spun on the previous layers and patterned to expose the emitter locations. A suitable metal 122 (such as Ti, Cr, or composite metals such as Ti/Au) is evaporated onto the wafer and then the photoresist is removed, leaving the evaporated metal only on those areas of the wafer where emitters are to be located. The emitter locating insulator islands 110 are then created by RIE of the insulator material not protected by the metal 122 using $CF_4/O_2$. See FIG. 5.

(2) The process then continues with step (c) of the first preferred embodiment with the exception that ion milling will also remove patterned metal 122 (the metal thickness is chosen such that it is completely removed during ion milling of the ohmic contact 108, therefore it does not appear in the final structure).

Figure 6:
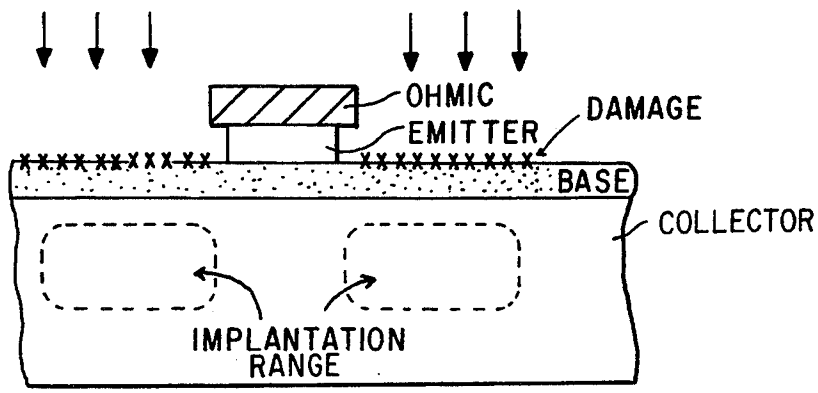
FIG. 6 is a cross sectional elevation view of a prior art implantation method.
Figure 7:
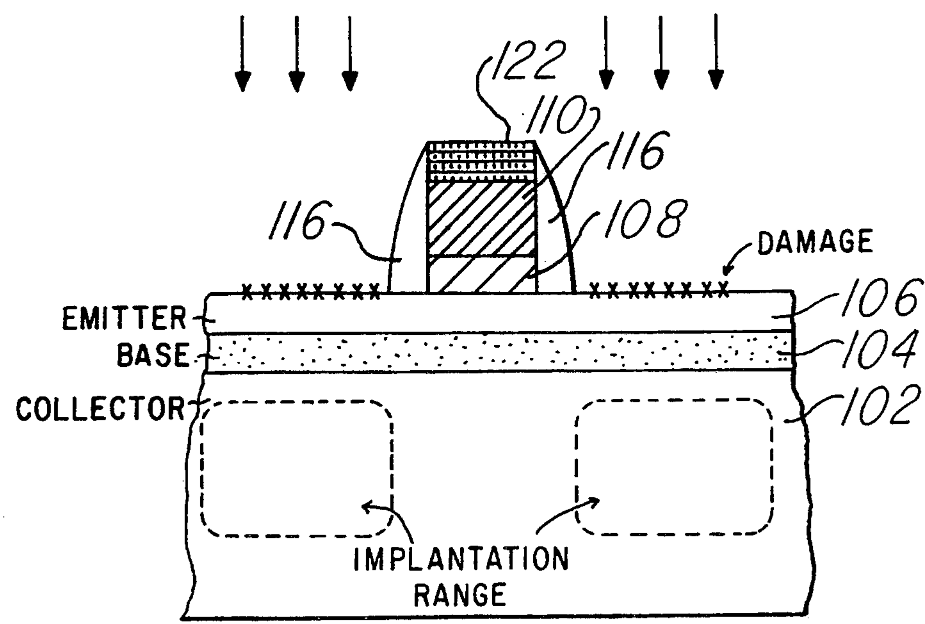
FIGS. 7 & 8 are cross sectional elevation views of a second modification to the first preferred embodiment and the steps of the first preferred embodiment fabrication method.
Figure 8:
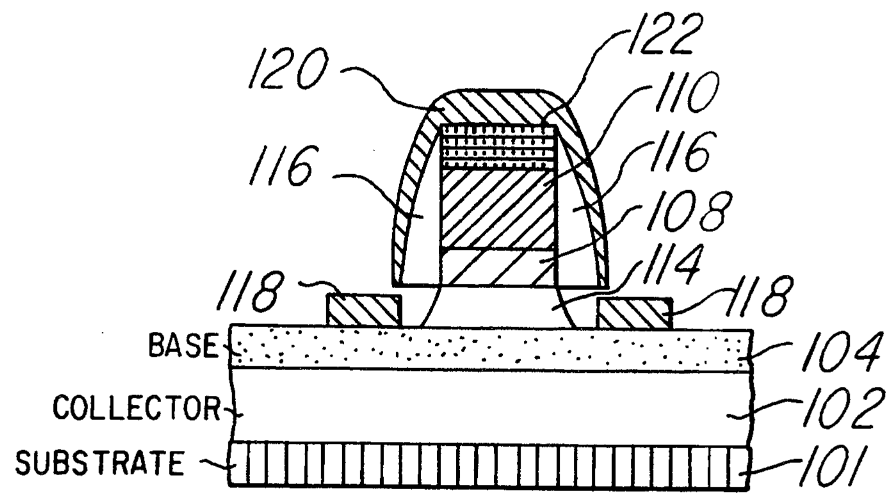

In a second modification, ion mill mask metal 122 is chosen to be thicker than in the first modification to facilitate deep ion implantation into the collector layer 102 to reduce extrinsic collector capacitance. Thus, the emitter locator insulation islands 110 and ion mill mask metal 122 serve as additional masks during a selective ion implantation process. The implanted ions can be boron, proton, or oxygen, and are chosen to have suitable ion damage properties in GaAs to convert conductive layers into insulating material. The ion energy (more than one energy may be needed) is chosen, typically 100–200 keV, to ensure that a majority of implanted ions are stopped in the collector layer 102. By using smaller ions such as boron and proton, it is also ensured that the ions do not damage the base epilayer 104 as they pass through it. With this additional masking capability, it is possible to use higher energies for deeper implantation to convert more of the collector layer 102 into insulating material, thus reducing the base-collector capacitance under the base contacts 118. Also, the availability of high energy implantation makes it possible to implant through the emitter epilayer 106 and the base epilayer 104 before the chemical etch (RIE). This helps to maintain low defect densities on the exposed base epilayer 104. It will also be appreciated that sidewall insulator 116 keeps implant damage away from the critical emitter 114 perimeter. FIG. 6 illustrates the prior art implantation method while FIG. 7 illustrates the second modification to the preferred embodiment which represents an improvement over prior art methods, where some of the implanted ions are scattered at the base layer surface, causing damage to the semiconductor crystal lattice. This damage increases surface state density and surface recombination velocity. Particularly disadvantageous is the creation of these surface states close to the emitter finger edges. Finally, FIG. 8 shows the resultant structure with base contacts 118 formed and metal 120 in contact with ion mill mask metal 122.

In a third modification, to increase ion implantation depth and hence further reduce parasitic base-collector capacitance, the ion mill mask metal 122 may be chosen to be thicker than required for ion milling of insulator 110 and emitter contact 108. Thus, after ion milling some of this metal 122 will remain, serving as an additional mask for ion implantation. Later in the process, it will be required to make contact to the emitter contact metal 108 and the base contact metal 118 for biasing and inputting of signal, respectively. The presence of this additional metal 122 will make electrical contact between the emitter and the base, therefore it must be removed.

Figure 9:
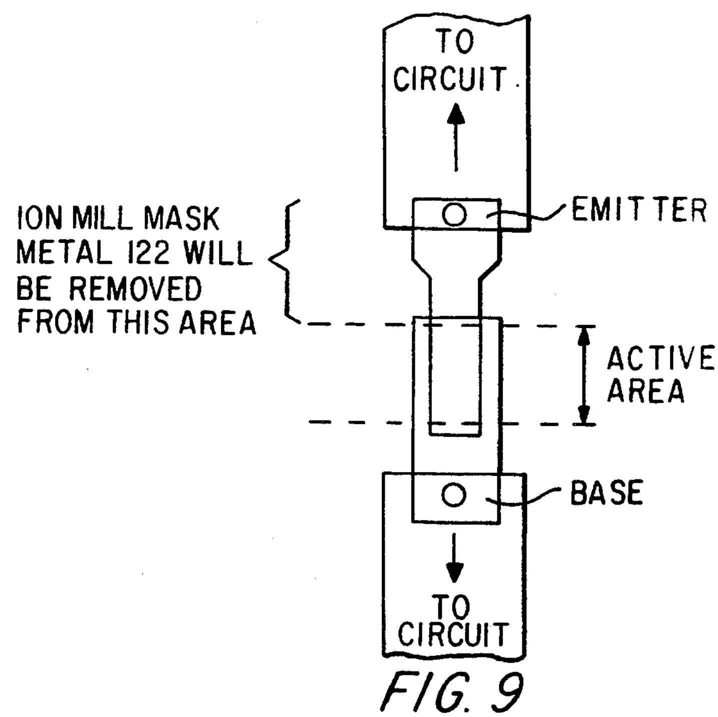
FIG. 9 is a plan view of a third modification to the first preferred embodiment and the steps of the first preferred embodiment fabrication method.

FIG. 9 shows a plan view of the emitter and base as preferably fabricated, with the base contact metal 118/120 overlapping only a portion of emitter contact metal 108. The portions of the emitter and base contacts outside of the active area are used to contact the circuit terminals (the rest of the surface is converted to insulating material prior to the start of emitter fabrication for device isolation).

Advantages of the first preferred embodiment method include its simplicity, the ability to form self-aligned emitter-base contacts without limiting emitter dimensions and the flexibility in forming the base contact's coverage of the emitter area, allowing for design of minimum emitter-base capacitance or minimum series base resistance.

What is claimed is:

1. A method of fabricating a heterojunction bipolar transistor, comprising the steps of:

(a) forming a collector layer over a semi-insulating semiconductor substrate;

(b) forming a base layer over said collector layer;

(c) forming an emitter layer over said base layer;

(d) forming an ohmic emitter contact layer over said emitter layer;

(e) forming an insulator layer over said ohmic emitter contact layer;

(f) removing said insulator layer and said ohmic emitter contact layer from all areas not covering an emitter location;

(g) forming insulator sidewalls abutting vertical surfaces of said insulator layer and said ohmic emitter contact layer, said insulator sidewalls also abutting a portion of a horizontal surface of said emitter layer;

(h) removing said emitter layer from all areas not covered by said insulator layer or by said insulator sidewalls; and (i) forming an ohmic base contact layer to be horizontally continuous over said insulator layer, said insulator sidewalls and a portion of said base layer, and to be vertically discontinuous between said insulator sidewalls and said portion of said base layer.

2. The heterojunction bipolar transistor device fabrication method of claim 1, comprising the further step of:

(a) forming said emitter layer with a semiconductor material with a wider bandgap than said base layer semiconductor material.

3. The heterojunction bipolar transistor device fabrication method of claim 1, comprising the further step of:

(a) forming said emitter layer with a semiconductor material with a wider bandgap than said collector layer semiconductor material.

4. The heterojunction bipolar transistor device fabrication method of claim 1, comprising the further steps of:

(a) forming said collector layer with GaAs on a GaAs substrate;

(b) forming said base layer with GaAs; and (c) forming said emitter layer with $Al_xGa_{1-x}As$.

5. The heterojunction bipolar transistor device fabrication method of claim 4, comprising the further steps of:

(a) doping said collector layer n-type;

(b) doping said base layer p-type; and (c) doping said emitter layer n-type.

6. The heterojunction bipolar transistor device fabrication method of claim 1, comprising the further step of:

(a) forming said emitter contact layer with AuGe/-Ni/Au.

7. The heterojunction bipolar transistor device fabrication method of claim 1, comprising the further step of:

(a) forming said emitter layer by epitaxial growth of in situ doped semiconductor material.

8. The heterojunction bipolar transistor device fabrication method of claim 1, comprising the further step of:

(a) forming a metal ion mill mask layer on said insulator layer.

9. The heterojunction bipolar transistor device fabrication method of claim 8, comprising the further step of:

(a) forming said metal ion mask layer with Ti.

10. The heterojunction bipolar transistor device fabrication method of claim 8, including the further step of:

(a) removing said metal ion mill mask from regions not in an active area of said heterojunction bipolar transistor.

11. The heterojunction bipolar transistor device fabrication method of claim 1, further including the step of:

(a) forming non-conductive regions by ion implantation in areas of said collector layer not beneath an emitter region.

12. The heterojunction bipolar transistor device fabrication method of claim 1, comprising the further step of:

(a) forming said base layer by epitaxial growth of in situ doped semiconductor material.

* * * * *